United States Patent
Mrazek et al.

(10) Patent No.: US 11,366,441 B2
(45) Date of Patent: Jun. 21, 2022

(54) PROGRAMMING APPARATUS

(71) Applicant: Electronic Product Services Limited, Kinsealy (IE)

(72) Inventors: Ludek Mrazek, Brno (CZ); Lukas Kraina, Brno (CZ)

(73) Assignee: Electronic Product Services Limited, Dublin (IE)

( * ) Notice: Subject to any disclaimer, the term of this patent is extended or adjusted under 35 U.S.C. 154(b) by 76 days.

(21) Appl. No.: 16/960,073

(22) PCT Filed: Feb. 19, 2019

(86) PCT No.: PCT/EP2019/054072
§ 371 (c)(1),
(2) Date: Jul. 3, 2020

(87) PCT Pub. No.: WO2019/162263
PCT Pub. Date: Aug. 29, 2019

(65) Prior Publication Data
US 2021/0063987 A1    Mar. 4, 2021

(30) Foreign Application Priority Data

Feb. 22, 2018  (EP) .................................... 18158220

(51) Int. Cl.
*G05B 19/042*   (2006.01)
*B65G 47/91*    (2006.01)
*G06Q 10/06*    (2012.01)

(52) U.S. Cl.
CPC ........ *G05B 19/0426* (2013.01); *B65G 47/912* (2013.01); *G05B 2219/2621* (2013.01);
(Continued)

(58) Field of Classification Search
CPC .............. B65G 47/912; G01R 31/2893; G05B 19/0426; G05B 19/41845;
(Continued)

(56) References Cited

U.S. PATENT DOCUMENTS

| | | | | |
|---|---|---|---|---|
| 6,230,067 B1 * | 5/2001 | White | ................ | H05K 13/0857 700/112 |
| 6,449,523 B1 * | 9/2002 | Johnson | ............. | H05K 13/0419 700/121 |

(Continued)

FOREIGN PATENT DOCUMENTS

| | | |
|---|---|---|
| EP | 1 100 303 | 5/2001 |
| WO | WO 01/30124 | 4/2001 |
| WO | WO 2007/025060 | 3/2007 |

*Primary Examiner* — Chun Cao
(74) *Attorney, Agent, or Firm* — LaMorte & Associates P.C.

(57) ABSTRACT

The present invention relates to a single integrated multi-function apparatus for programming and repackaging programmable devices comprising: input means operable to provide a plurality of un-programmed devices; programming means operable to program the un-programmed devices; checking means operable to inspect predefined characteristics of devices programmed by the programming means; moving means operable to convey programmed devices to the checking means in a path of movement defining a first (X) axis of the apparatus, and placement means operable to move devices to and from the programming means in a path of defining a second (Y) axis of the apparatus. The moving means further conveys programmed devices along the first (X) axis to checking means operable to inspect predefined characteristics of devices programmed by the programming means, and operation of the input means, programming means, moving means, placement means and checking means are coordinated and controlled by software control means.

11 Claims, 6 Drawing Sheets

(52) U.S. Cl.
CPC .............. *G05B 2219/32015* (2013.01); *G06Q 10/06395* (2013.01)

(58) Field of Classification Search
CPC ...... G05B 19/41865; G05B 2219/2621; G05B 2219/2629; G05B 2219/32015; G05B 2219/45063; G05B 2219/45089; G06Q 10/06395; Y02P 90/02
USPC ........................................................ 700/112
See application file for complete search history.

(56) References Cited

U.S. PATENT DOCUMENTS

| | | | | |
|---|---|---|---|---|
| 6,647,303 | B1* | 11/2003 | Johnson | G05B 19/41815 700/95 |
| 2004/0262128 | A1* | 12/2004 | Bolotin | H05K 13/08 198/468.2 |

* cited by examiner

PROGRAMMING APPARATUS

Machines for programming devices, such as programmable microchips or integrated circuits, receive un-programmed or blank devices from input means, such as a tape, a tube or a tray, and convey the devices to a programmer which in turn programs the devices with the desired software. Once programmed the devices are returned as output and optionally repackaged for subsequent delivery and installation in machine or mechanism requiring the device.

However, such programming machines suffer from the drawback that without significant and expensive add-ons and/or costly manual intervention they are unable to program devices from a wide range of input means and also lack the fully integrated functionality needed to deliver programmed devices with all of the desired finished characteristics, such as required markings and quality control checks.

According to the present invention there is provided a single integrated multi-function apparatus for programming and repackaging programmable devices comprising:

input means operable to provide a plurality of un-programmed devices;

moving means operable to convey devices in a path of movement defining a first (X) axis of the apparatus;

programming means provided substantially adjacent to the moving means and operable to program the un-programmed devices, the programming means is adapted for movement along the first (X) axis and comprises a plurality of programming sockets each for receiving and programming a device, and placement means operable to move devices between the input means, the moving means, the programming means and an output for programmed devices in a path of movement defining a second (Y) axis of the apparatus; and characterised in that the moving means further conveys programmed devices from the programming means along the first (X) axis to checking means operable to check predefined characteristics of devices programmed by the programming means, and in which devices passing the check performed by the checking means are conveyed by the placement means to the output means for subsequent repackaging, wherein operation of the input means, programming means, moving means, placement means and checking means are coordinated and controlled by software control means.

The present invention provides an apparatus for programming of blank or un-programmed devices in which a moving means of the apparatus conveys devices in a first (X) axis and a placement means moves devices in a second (Y) axis. The invention provides a programming means having multiple programming sockets and which is configured to move back and forth along the first (X) axis.

With the use of software control means the functions, operation and movement of the input means, placement means, programming means, checking means and the moving means are coordinated to enable multiple devices to be placed in and programmed by the programming means, thereby increasing the throughput of programmed devices, without an overall increase in size footprint of the apparatus.

The present invention allows for alternative input means to supply blank devices to the apparatus for programming and subsequent repackaging. The present invention, by combining a plurality of modules in the form of input means, placement means, programming means, moving means and checking means provides a single integrated machine in which the operation and function of the modules are configured to operate in a coordinated way by software control means to thereby provide a multi-function single programming apparatus with a relatively small footprint which results in an effective low cost device for programming input devices.

Preferably, functions of the apparatus are controlled by software control signals from the software control module.

Preferably, the moving means extends below the path of movement of the placement means.

Preferably, the moving means comprises a main track operable to receive and move devices along the first (X) axis of the apparatus.

Alternatively, the moving means comprises shuttle means operable to receive and move the devices back and forth along the first (X) axis of the apparatus.

Preferably, the shuttle means comprises at least one receiving pocket or seat operable to hold a device for movement back and forth along the first (X) axis.

Preferably, the input means may be provided by an input mechanism operable to provide devices to be programmed.

Preferably, the input means may be provided by at least two different types of input mechanism, each input mechanism operable to provide devices to be programmed.

Alternatively, the input means may be provided by at least three different types of input mechanism, each input mechanism operable to provide devices to be programmed.

Preferably, an input mechanism is provided as a reel and tape, a tray or a tube.

The present invention is thus configured to provide different types of input mechanism on a single apparatus. It will however be understood that such input mechanisms, or combinations thereof, although provided on the same apparatus operate one at a time to provide blank devices and do not operate contemporaneously.

Preferably, the reel and tape comprises an array of devices enclosed along a tape in which the tape is wound on an arrangement of reels mounted to the apparatus, and in which the tape is supported on the main track of the moving means and moves along the first (X) axis, such that the movement thereof is coordinated with movement of the placement means along the (Y) axis.

Preferably, the tray comprises an arrangement of devices thereon and is supported on a moveable platform positioned adjacent to the main track, and in which movement of the platform is along the first (X) axis and coordinated with movement of the placement means along the second (Y) axis.

Preferably, an input mechanism is a tube means comprising devices loaded therein.

Irrespective of the type of input mechanism, the apparatus is configured such that programmed devices are returnable as output to a tape or to a tray by the placement means.

Thus if the apparatus is configured such that a tape and reel input mechanism provides un-programmed devices, programmed device may be returned as output to the tape or alternatively to a tray. Additionally, if a tray or stack of trays provides un-programmed devices the programmed device may be returned as output to the same tray or to a tape mounted to the apparatus.

Preferably, the apparatus further comprises marking means to place indicia marking on the programmed devices. Preferably, the marking means is provided by a colour dot or laser marking device.

Preferably, the marking means is provided along the first (X) axis and programmed devices are further conveyed to the marking means by the moving means along the first (X) axis.

Preferably, the checking means and marking means are positioned adjacently on the first (X) axis.

Preferably, the placement means comprises a lifting head (pick and place head) provided as a suction cup operable to apply a suction force to lift and handle devices. The invention may be configured with placement means comprising a plurality of lifting heads, such as two, three, four or more lifting heads, to facilitate lifting and placement and removal of a plurality of devices into and from the programming means.

Preferably, the programming means comprises any number of programming sockets, such as two, four, six, eight, twelve or more sockets as required.

Preferably, the placement means is moved along the second axis by an overhead gantry.

Preferably, the apparatus further comprises 3D co-planarity inspection means provided along the second (Y) axis and movable with the placement means by the overhead gantry.

Preferably, the apparatus further comprises vision alignment means which is movable along the second (Y) axis with the placement means. The vision alignment means is operable to ensure correct positioning of devices inserted into the programming sites.

Preferably, the predefined characteristics of a programmed device checked by the checking means comprise one or more of: characters and markings; device orientation; PIN 1 identification; device shape; and presence/absence of a device.

Preferably, devices passing the check performed by the checking means are conveyed by the placement means to the output means. Conversely, devices failing the check are moved by the placement means to a failed devices output tray.

The invention will be more clearly understood from the following description of some embodiments thereof, given by way of example only, with reference to the accompanying drawings, in which.

Figure 1:
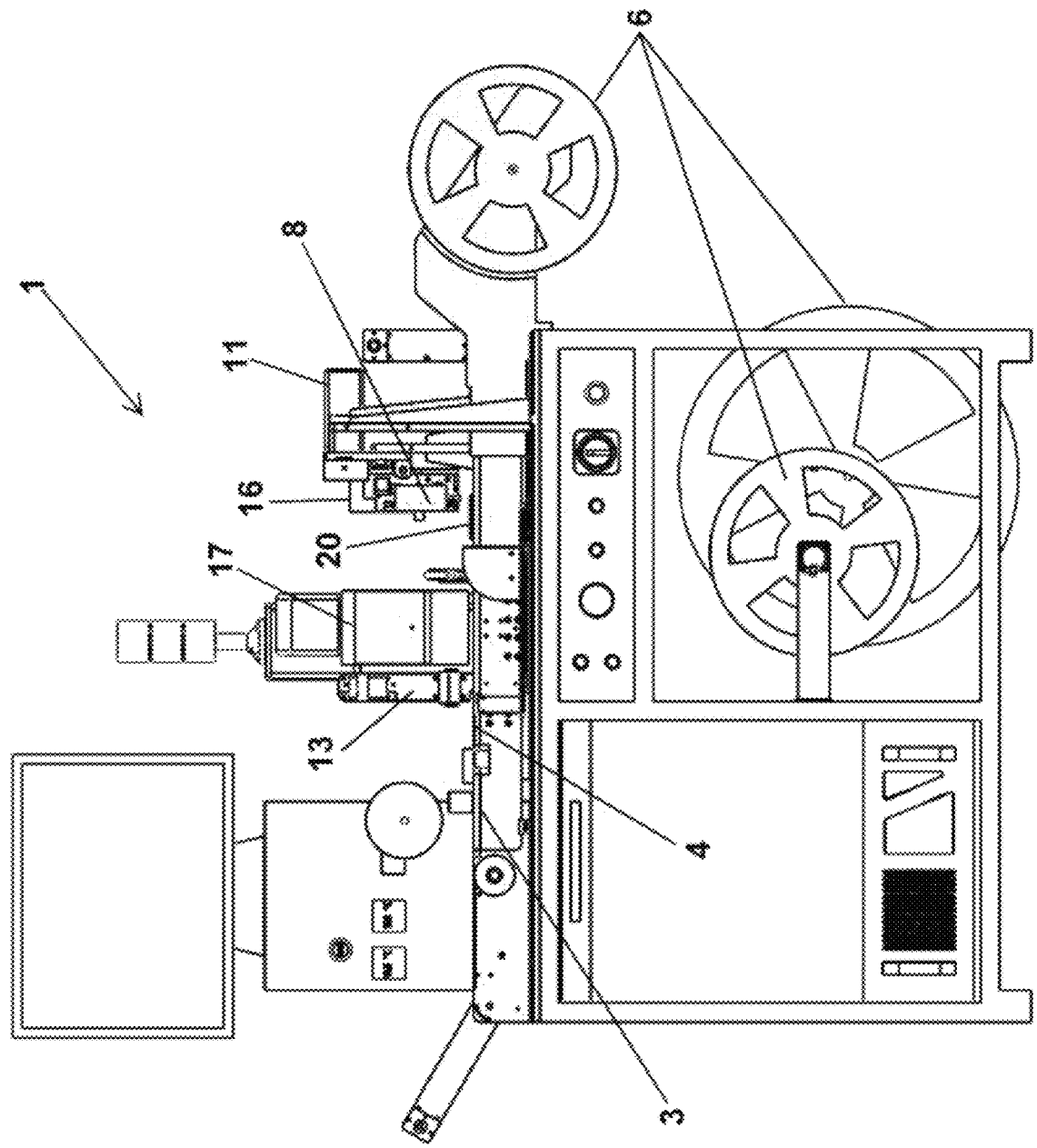
FIG. 1 is side view of a programming apparatus according to the invention.
Figure 2:
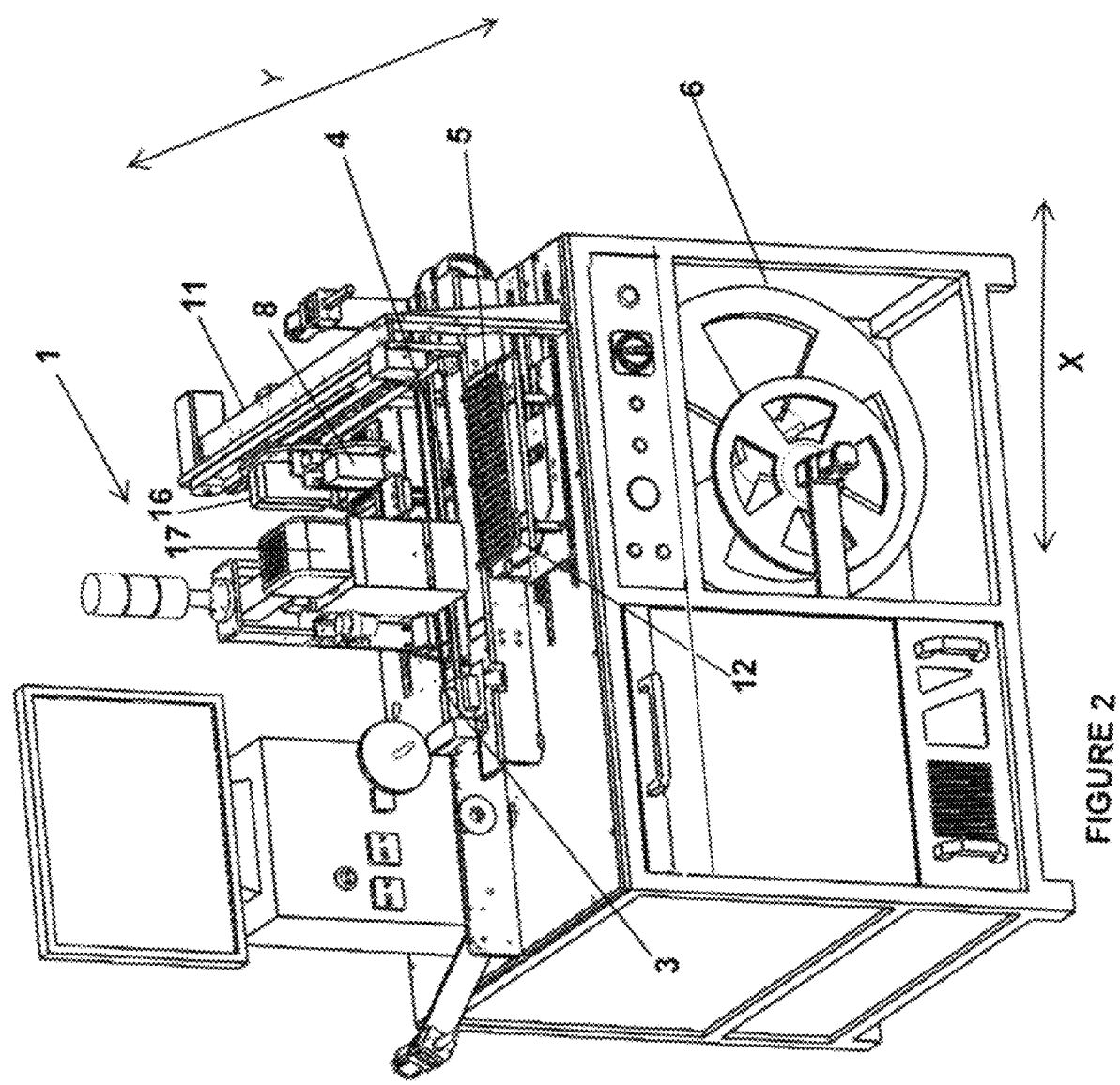
FIG. 2 is a side perspective view of the programming apparatus shown in FIG. 1.
Figure 3:
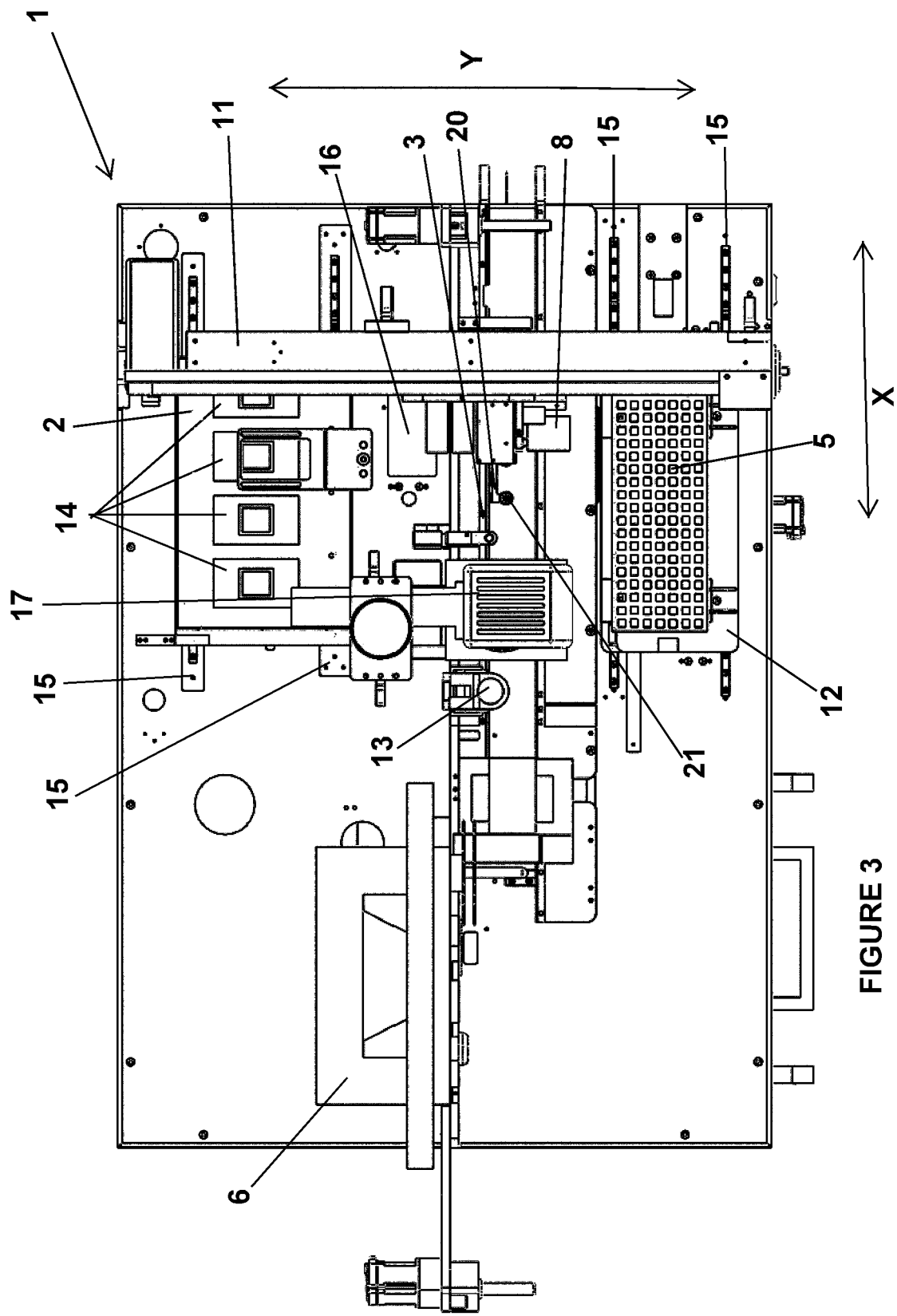
FIG. 3 is a plan view of the programming apparatus shown in FIG. 1.
Figure 4:
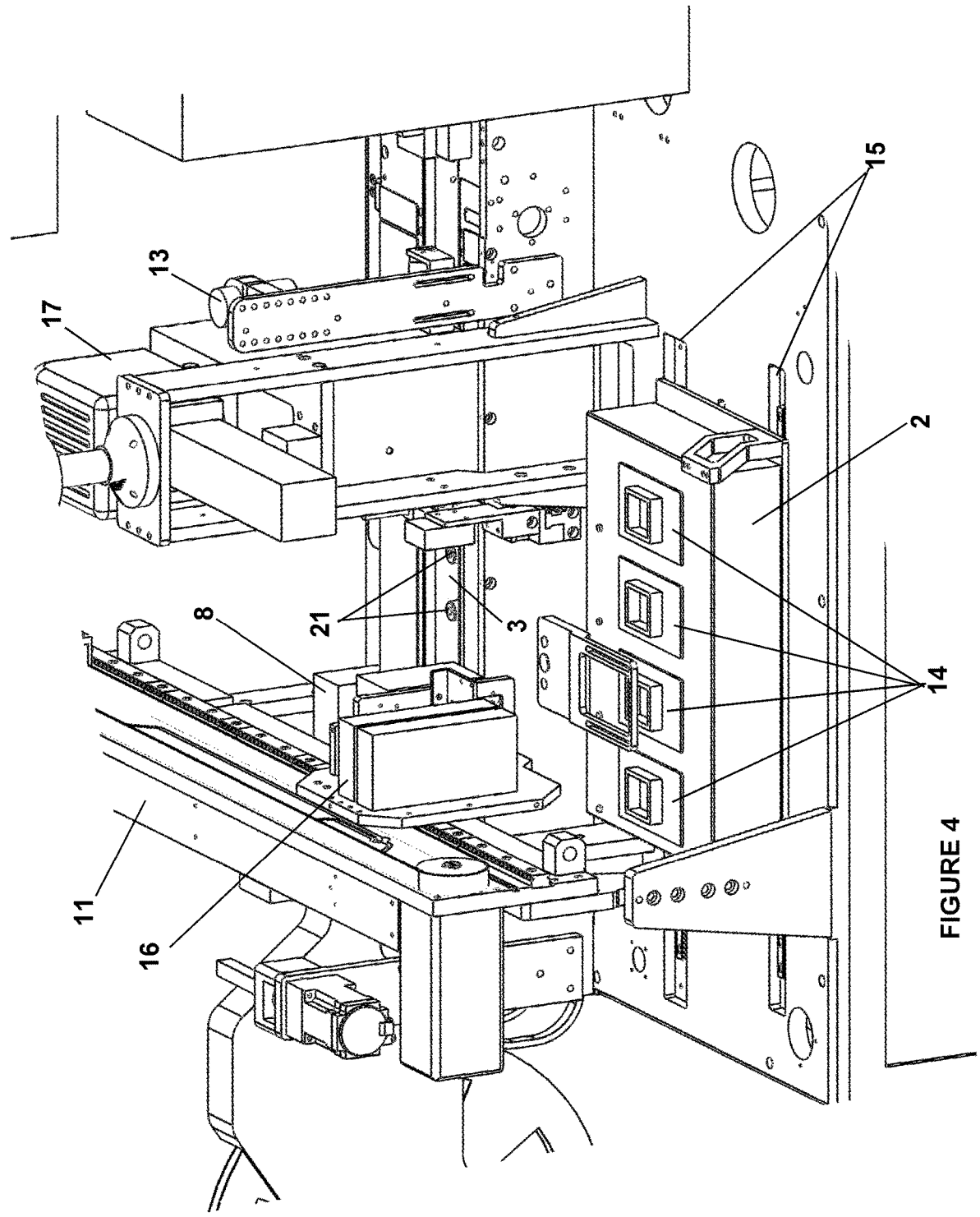
FIG. 4 is a detailed side view showing programmer means of the programming apparatus shown in FIG. 1.
Figure 5:
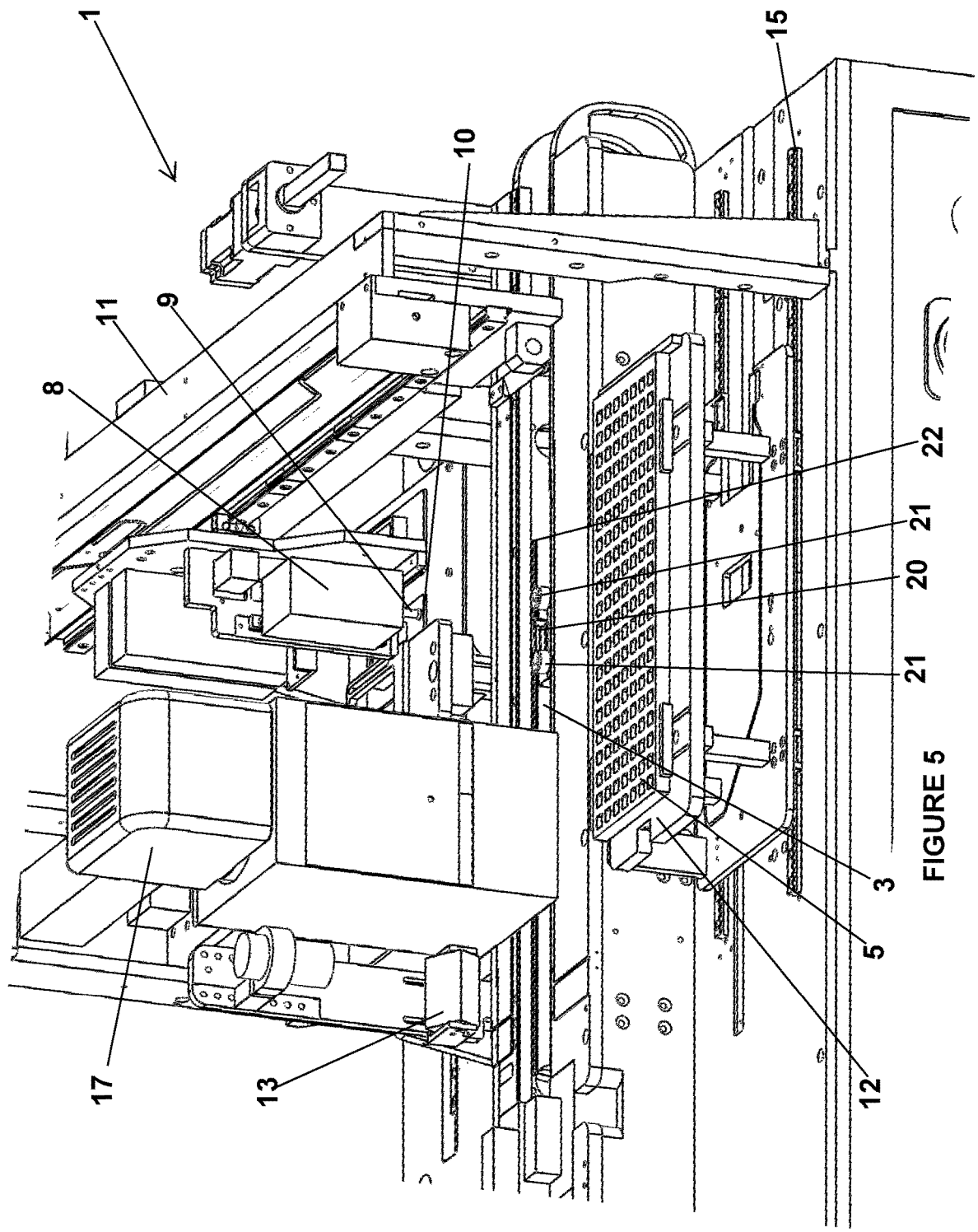
FIG. 5 is a further detailed side view showing a first input mechanism provided as a tray of the programming apparatus shown in FIG. 1.

Referring to the drawings, shown is an apparatus 1 for programming programmable devices, such as programmable microchips or integrated circuits. The apparatus 1 comprises input means to provide a plurality of un-programmed devices to programming means 2 which is operable to program the blank or un-programmed devices.

It will be understood that programmed control software executing on a computer processor provides the overall control of movement and activation of features of the present invention via a software control means, and functions of the apparatus 1 are controlled and coordinated by software control signals from the software control means.

The programming means 2 comprises a plurality of programming sites or sockets 14, each for receiving a blank device to be programmed. The programming means 2 shown comprises four programming sockets 14 although it will be understood that the number of sockets 14 may be adjusted and configured as required or as desired. For example, the programming means may comprise six, eight, ten, twelve or more sockets as required depending on a desired throughput of the apparatus. The programming sockets 14 burn software code to an un-programmed device received into the site 14.

Also shown is moving means, indicated generally by the reference numeral 3, positioned substantially adjacent to the programming means 2 and operable to convey devices in a path of movement defining a first (X) axis of the apparatus. The moving means 3 may be provided as a main track 4 which moves in a conveyor type manner and is operable to receive and move devices along the first (X) axis of the apparatus 1. Alternatively, the moving means 3 comprises shuttle means 20 operable to receive and move the devices back and forth along the first (X) axis of the apparatus 1. The shuttle means 20 comprises at least one receiving pocket or seat 20 operable to hold a device or devices for movement back and forth along the first (X) axis as required.

The apparatus 1 further comprises placement means 8 operable to move devices to and from the programming means 2 in a path of movement defining a second (Y) axis of the apparatus 1. It will be understood that the first (X) axis is perpendicular relative to the second (Y) axis.

The path of movement of the placement means 8 and the moving means 3 intersect to enable the placement means 8 to cooperate with the moving means 3 for placement in and removal of devices from the programming means 2. As shown, the moving means 3 extends below the path of movement of the placement means 8. The placement means 8 is moved by an overhead gantry 11.

The moving means 3 conveys the programmed devices along the first (X) axis to checking means 13 operable to inspect predefined characteristics of devices programmed by the programming means 2. The predefined characteristics of a programmed device checked by the checking means 13 comprise one or more of: characters and markings; device orientation; PIN 1 identification; device shape; and presence/absence of a device. The checking means 13 is provided as an automatic optical inspection system.

The input means may be provided by at least two or at least three different types of input mechanisms, each input mechanism operable to provide devices to be programmed. The input means thus comprises alternative input mechanisms, which in the instance shown may be provided by a tray 5, a tape and reel 6 and tube feeder 7, each independently operable to supply and present devices to the apparatus 1 for programming by the programming means 2. A combination of the input mechanisms 5, 6, 7 may also be provided.

The tape and reel 6 comprises an array of devices enclosed along a tape 6 which is wound on an arrangement of reels 6 mounted to the apparatus 1. The tape 6 when unwound from the reel 6 is supported on the main track 4 and advanced along the first (X) axis of the apparatus 1. It will be understood that blank or un-programmed devices are initially packaged and supplied to the apparatus 1 along the tape 6 and the apparatus 1 is configured to initially remove an outer cover of the tape 6 to expose the un-programmed devices in seats along the tape 6. Devices are presented to the apparatus 1 on the tape 6 for removal by the placement means 8 to the programming means 2, processing by the apparatus 1 and subsequent repackaging in the tape 6 by the apparatus 1. Such repackaging involves the outer cover being re-applied to the original carrier tape 6.

The tray mechanism 5 comprises an arrangement of devices thereon and is supported on a moveable platform 12 positioned adjacent to the main track 4, and which movement of the platform 12 is along the first (X) axis and coordinated with movement of the placement means 8 along the second (Y) axis.

Figure 6:
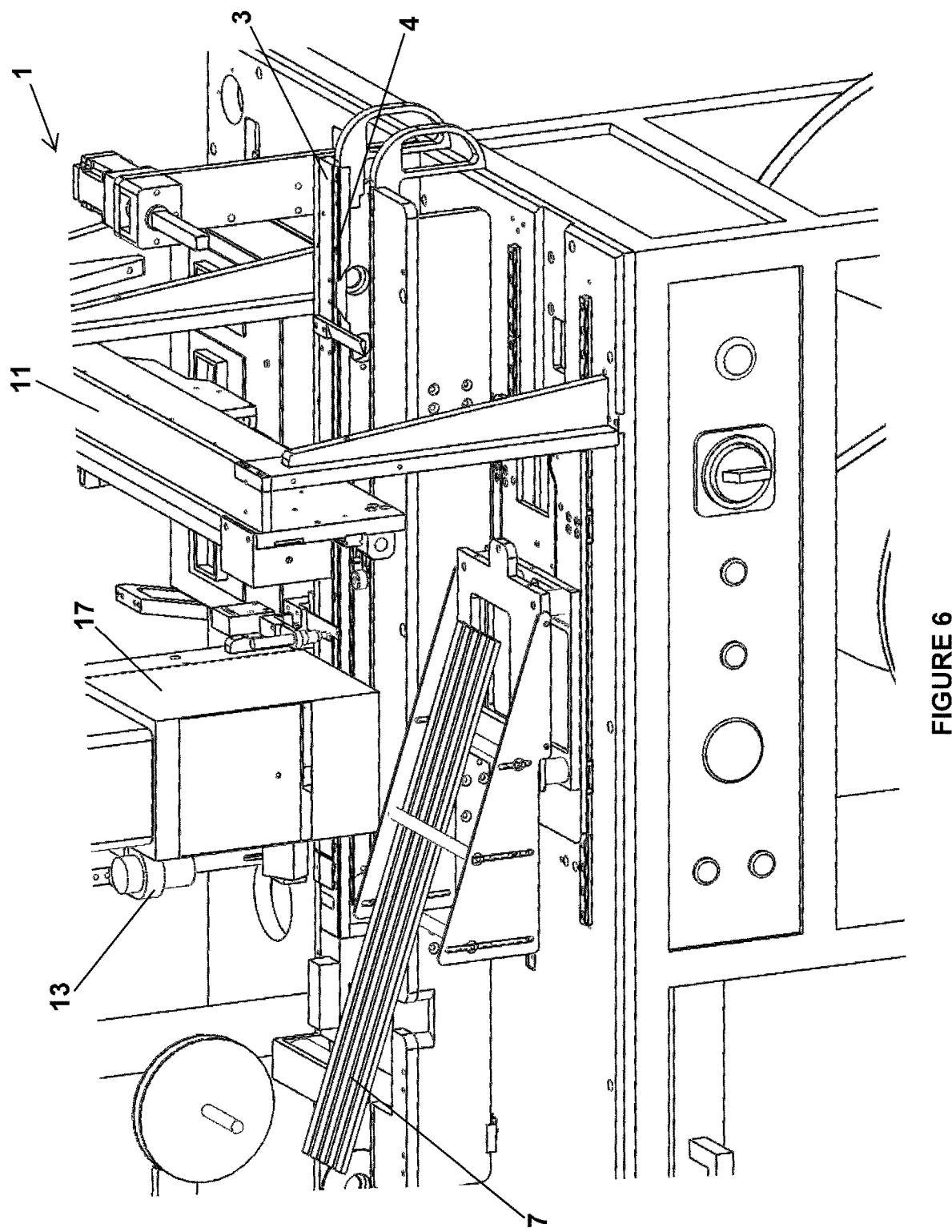
FIG. 6 is a further detailed side view showing alternative input means provided as a tube feeder of the programming apparatus shown in FIG. 1.

An input means may also be provided as the tube feeder arrangement 7 shown in FIG. 6, operable to supply blank input devices from tubes containing such un-programmed devices.

The tray 5 or alternatively the tube feeder 7 may be mounted on a movable platform 12 mounted on tracks 15 to move the input mechanism as required to ensure the devices provided thereby are positioned and aligned with the placement means 8 to be lifted by the suction cup 10 of the lifting head 9. In the instance shown, the platform 12 is configured to move back and forth along the first (X) axis under the path of movement of placement means 8.

Irrespective of the type of input mechanism 5, 6, 7 the apparatus 1 is configured such that programmed devices are returnable as output to a tape 6 or to a tray 5 by the placement means 8. Accordingly, if the apparatus 1 is configured such that the tape and reel 6 provides un-programmed devices for programming, the programmed devices may be returned as output to tape. Additionally, if a tray 5 or stack of trays 5 provides un-programmed devices, programmed devices may be returned as output to the same tray 5 or to tape 6 mounted to the main track 4.

The apparatus 1 is configured to thus provide tray to tray programming; tray to tape programming; tape to tape programming and tube to tape programming.

The placement means 8 is operable to pick up and move devices from the various optional input means 5, 6, 7 to the programming means 2 for programming. The placement means 8 operates as a pick and place head to pick up a blank device from the input means 5, 6, 7 using a lifting head 9 provided as a suction cup 10 operable to apply a suction force to lift devices to be positioned in the programming means, to moving means (i.e. the tape 6 moving on the main track 4 or the shuttle means 20), or an output as required.

The programming means 2 is mounted on tracks 15 and adapted for coordinated movement by a predetermined distance back and forth along the first (X) axis with movement of the placement means 8 so that a plurality of devices are positioned in the programming means to be programmed simultaneously. Thus as the placement means 8 picks up a device from an input mechanism 5, 6, 7, the programming means 2 is moving back or forth on the first (X) axis to align a free unused programming socket 14 with the placement means 8 carrying a device to be programmed on the second (Y) axis. As the programming means 2 is moving in this manner an empty socket is aligned with the second (Y) axis so that the placement means 8 may position the device in an empty socket for programming. The programming means 2 then moves to present a programmed device located in a socket for removal and subsequent processing by the apparatus 1. Thus all sockets 14 may be fully utilised to increase throughput of programmed devices by the apparatus 1.

The apparatus 1 further comprises 3D co-planarity inspection means provided along the second (Y) axis and movable with the placement means 8 by the overhead gantry 11. Vision alignment means 16 is also provided adjacent and movable with the placement means 8 by the overhead gantry 11 along the second (Y) axis. The vision alignment means is operable to ensure correct positioning of devices inserted into the programming sockets 14.

Also shown is marking means 17 to place indicia marking on the programmed devices. The marking means 17 is provided by a colour dot or laser marking device. Such a marking means 17 is used for traceability of the programmed devices and the checking means 13 and marking means 17 are adjacently positioned on the first (X) axis. The marking means 17 is provided along the first (X) axis and programmed devices are further conveyed to the marking means 17 by the moving means 3 along the first (X) axis.

Devices passing the check performed by the checking means 13 are conveyed by the placement means 8 to output means for repackaging, which as described above, may be to the tray 5 or tape 6. Conversely, devices failing the check are moved by the placement means to a failed devices output tray.

The operation and functions of the apparatus 1 are coordinated and controlled by software control means so that a plurality of devices may be programmed in the programming means simultaneously and then conveyed by the moving means to the checking means and other functions of the apparatus 1 and to the desired output tape or tray as required.

The present invention combines a plurality of modules in the form of input means, programming means, marking means and checking means provided along a first (X) axis and placement means, 3D co-planarity inspection means and vision alignment means provided along a second (Y) axis of the apparatus. The invention provides a single integrated machine in which the modules are configured to cooperate in a fully coordinated way by a software control means to provide a programming apparatus with a relatively small footprint and so results in an effective low cost device for programming input devices.

It is to be understood that the invention is not limited to the specific details described herein which are given by way of example only and that various modifications and alterations are possible without departing from the scope of the invention as defined in the appended claims.

The invention claimed is:

1. A single integrated multi-function apparatus for programming and repackaging programmable devices including:
    input means operable to provide un-programmed devices, wherein said input means is selected from a group comprising a reel and tape of un-programmed devices, a tray of un-programmed devices and a tube of un-programmed devices;
    moving means operable to convey the un-programmed devices in a path of movement defining a first (X) axis of the apparatus;
    programming means provided substantially adjacent or near to the moving means and operable to program the un-programmed devices, the programming means is adapted for movement along the first (X) axis and includes a plurality of programming sockets each for receiving and programming the un-programmed devices, therein creating programmed devices, and
    placement means operable to move the un-programmed devices between the input means, the moving means, the programming means and an output for the programmed devices in a path of movement defining a second (Y) axis of the apparatus; and
    wherein the moving means further conveys the programmed devices from the programming means along the first (X) axis to an automatic optical inspection system operable to perform a check of predefined characteristics of the programmed devices programmed by the programming means, wherein predefined characteristics of the programmed devices are selected from a group consisting of printed characters, printed markings, orientation, shape, pin identification and physical presence, and output means for repackaging the programmed devices that pass the check performed by the automatic optical inspection system, wherein the programmed devices are conveyed by the placement means to the output means and are repackaged on a second input means, wherein said second input means is selected from a group comprising a reel and tape, a tray, and a tube, and wherein operation of the programming means, the moving means, the placement means and the automatic optical inspection system are coordinated and controlled by software control means.

2. The apparatus as claimed in claim 1, in which functions of the apparatus are controlled by software control signals from the software control means.

3. The apparatus as claimed in claim 1, in which the moving means includes a main track operable to receive and move the un-programmed devices along the first (X) axis of the apparatus.

4. The apparatus as claimed in claim 1, in which the moving means includes shuttle means operable to receive and move the un-programmed devices back and forth along the first (X) axis of the apparatus.

5. The apparatus as claimed in claim 4, in which the shuttle means includes at least one receiving pocket or seat operable to hold the un-programmed devices for movement back and forth along the first (X) axis.

6. The apparatus as claimed in claim 1, wherein the input means is a reel and tape of the un-programmed devices in which the reel and tape includes an array of the un-programmed devices enclosed along a tape in which the tape is wound on a reel mounted to the apparatus, and in which the tape is supported by the moving means and moves along the first (X) axis, such that the movement thereof is coordinated with movement of the placement means along the (Y) axis.

7. The apparatus as claimed in claim 1, wherein the input means is a tray of the un-programmed devices in which the tray is supported on a moveable platform positioned adjacent to the movement means, and which movement of the platform is along the first (X) axis and coordinated with movement of the placement means along the second (Y) axis.

8. The apparatus as claimed in claim 1, further comprising marking means to place indicia marking on the programmed devices, in which the marking means is provided along the first (X) axis and programmed devices are further conveyed to the marking means by the moving means along the first (X) axis.

9. The apparatus as claimed in claim 1, further comprising 3D co-planarity inspection means which is movable along the second (Y) axis with the placement means.

10. The apparatus as claimed in claim 1, further comprising vision alignment means which is movable along the second (Y) axis with the placement means.

11. The apparatus as claimed in claim 1, in which the placement means includes a lifting head provided as a suction cup operable to apply a suction force to lift devices to be positioned and is moved along the second (Y) axis by an overhead gantry.

* * * * *